United States Patent [19]

Iwahashi

[11] Patent Number: 4,484,358
[45] Date of Patent: Nov. 20, 1984

[54] RECEIVER HAVING SWITCHED CAPACITOR FILTER

[75] Inventor: Koji Iwahashi, Tokyo, Japan

[73] Assignee: Nippon Electric Co., Ltd., Japan

[21] Appl. No.: 473,112

[22] Filed: Mar. 7, 1983

[30] Foreign Application Priority Data

Mar. 5, 1982 [JP] Japan .................................. 57-34601

[51] Int. Cl.³ .......................... H04B 1/10; H04B 1/26
[52] U.S. Cl. .................................... 455/213; 455/307; 455/312
[58] Field of Search ................................ 455/211–213, 455/307, 312, 335, 339, 340

[56] References Cited

U.S. PATENT DOCUMENTS 4,087,641 5/1978 Sugai .................................. 455/307

FOREIGN PATENT DOCUMENTS 35959 3/1977 Japan .................................. 455/213

Primary Examiner—Marc E. Bookbinder
Attorney, Agent, or Firm—Ostrolenk, Faber, Gerb & Soffen

[57] ABSTRACT

A receiver utilizing a switched capacitor filter is disclosed. The switched capacitor filter has a band pass determined by a control signal applied thereto. A waveform shaping circuit generates the control signal as a function of a received signal which has been modulated in angle and amplified. The wave shaper generates the control signal only when the amplified signal is above a predetermined value and generates the signal at a frequency which causes the switched capacitor filter to operate at the correct band pass.

7 Claims, 8 Drawing Figures

RECEIVER HAVING SWITCHED CAPACITOR FILTER

BACKGROUND OF THE INVENTION

The present invention relates to a receiver and, more particularly, to a receiver in which an audio frequency band circuit includes a filter of the type using a switched capacitor.

Receivers today are increasingly miniaturized and this owes a great deal to the progress in IC technology, especially LSI technology. In parallel with the decrease in size of a receiver, there has arisen a keen demand for integration of a filter which is included in an audio frequency band circuit of the receiver. Such a filter usually comprises an active filter which has a resistor and a capacitor therein. It is relatively easy with LSI technology to provide capacitors of highly accurate capacitances. This is the reason behind the use of switched capacitors for such active filter in place of resistors. For example, a filter using a switched capacitor is described in the paper "MOS Sampled Data Recursive Filters Using Switched Capacitor Integrators," IEEE JOURNAL OF SOLID-STATE CIRCUITS, Vol. SC-12, No. 6, December 1977.

A clock signal for switching is indispensable for operating a switched capacitor and such has heretofore been implemented by a circuit which is exclusively used for the generation of a clock signal. The clock generator circuit, however, adds to the number of necessary structural elements of a receiver and thereby makes the construction intricate and the reliability poor.

Meanwhile, a receiver applicable to a system which handles a phase- or frequency-modulated signal is furnished with a squelching function in order to remove noise which would appear in an audio amplifier output during no-signal periods. It has been customary to allocate a special circuit solely for this function. This, as in the case of the clock generator for a switched capacitor, results in a complicated circuit arrangement and a degraded reliability of operation.

SUMMARY OF THE INVENTION

It is therefore an object of the present invention to provide a receiver which is simpler in construction and higher in reliability than the prior art receivers due to the provision of a circuit which serves both the clock generating function and squelching function.

In accordance with the present invention, a receiver is provided which includes a first amplifier means for receiving and amplifying a signal which has been modulated in angle. A demodulator means demodulates the angle-modulated signal and is connected to an output of the first amplifier means. A switched capacitor filter means has a switched capacitor and selects an audio frequency signal out of the output of the demodulator means and amplifies the audio frequency signal. The switched capacitor filter means has a pass band which has dependency on a frequency of a control signal for switching the switched capacitor. A waveform shaping means shapes the waveform of the output of the first amplifier means when the level of the output is above a predetermined level. The waveform shaping means supplies the output thereof to the switched capacitor filter as the control signal.

BRIEF DESCRIPTION OF THE DRAWINGS

Other objects, features and advantages of the present invention will become more apparent from the following description taken with the accompanying drawings, in which.

DESCRIPTION OF THE PRIOR ART

Figure 1:
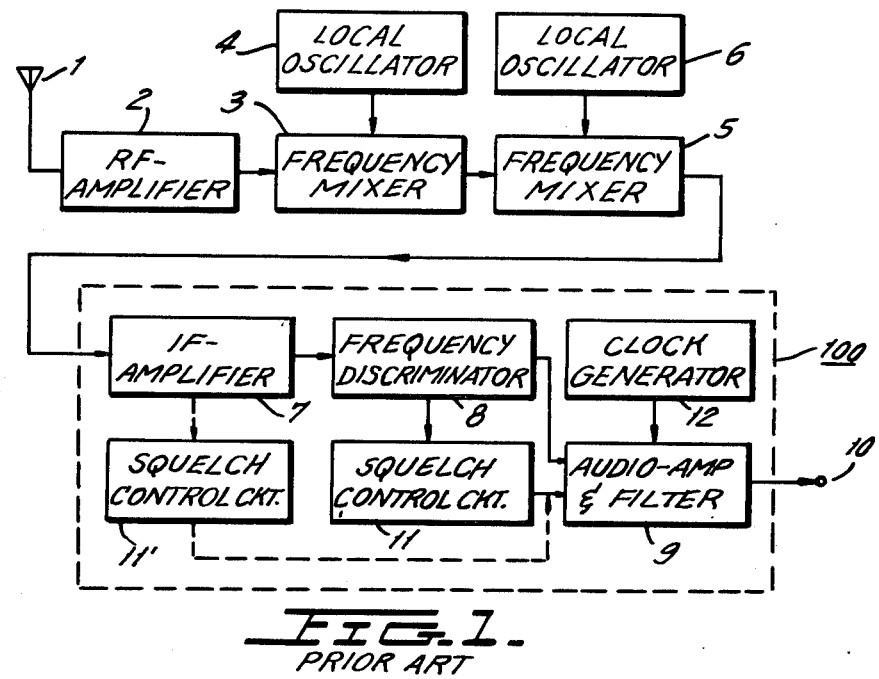
FIG. 1 is a block diagram of a conventional double superheterodyne type receiver.

Referring to FIG. 1 of the drawings, an angle-modulated (i.e. phase- or frequency-modulated) carrier wave comes into the receiver through an antenna 1 and is fed therefrom to a radio frequency amplifier 2. A first frequency mixer 3 mixes the output of the amplifier 2 with the output of a first local oscillator 4 to provide a first intermediate frequency (IF) signal. A second frequency mixer 5 mixes the first IF signal with the output of a second local oscillator 6 thereby providing a second intermediate frequency (IF) signal. An intermediate frequency (IF) amplifier 7 amplifies the second IF signal and supplies its output to a frequency discriminator 8. The gain of the IF amplifier 7 is predetermined such that the output of the IF amplifier 7 becomes saturated with receiver noise even when no signal is received by the receiver. The frequency discriminator 8 demodulates the output of the IF amplifier 7 into an audio frequency signal which is then coupled to an audio frequency circuit 9, which serves as a combined amplifier and filter. The audio signal, with its amplitude limited to a predetermined level, is fed from the circuit 9 to an output terminal 10.

For the ease of large scale integration of the audio frequency circuit 9, an audio frequency filter included in the circuit 9 is of the type using a switched capacitor. In this case, two different kinds of switching clock signals are required for the switched capacitor and are constituted by non-inverted and inverted clock signals supplied from a clock signal generator 12. The clock generator 12 may comprise a combination of a C-MOS inverter and a crystal, a Colpitts oscillator or the like.

A squelch control circuit 11 (or 11') is installed in the receiver to remove noise which may appear in the output of the audio frequency circuit 9 upon lowering of the receiver input level. In detail, the squelch control circuit 11 turns off the audio frequency circuit 9 when it detects a noise component outside the audio frequency band which may be contained in the demodulated output of the frequency discriminator 8. The squelch control circuit 11', on the other hand, controls the audio frequency circuit 9 by detecting the level of the IF signal which is outputed from the IF amplifier 7.

Figure 2:
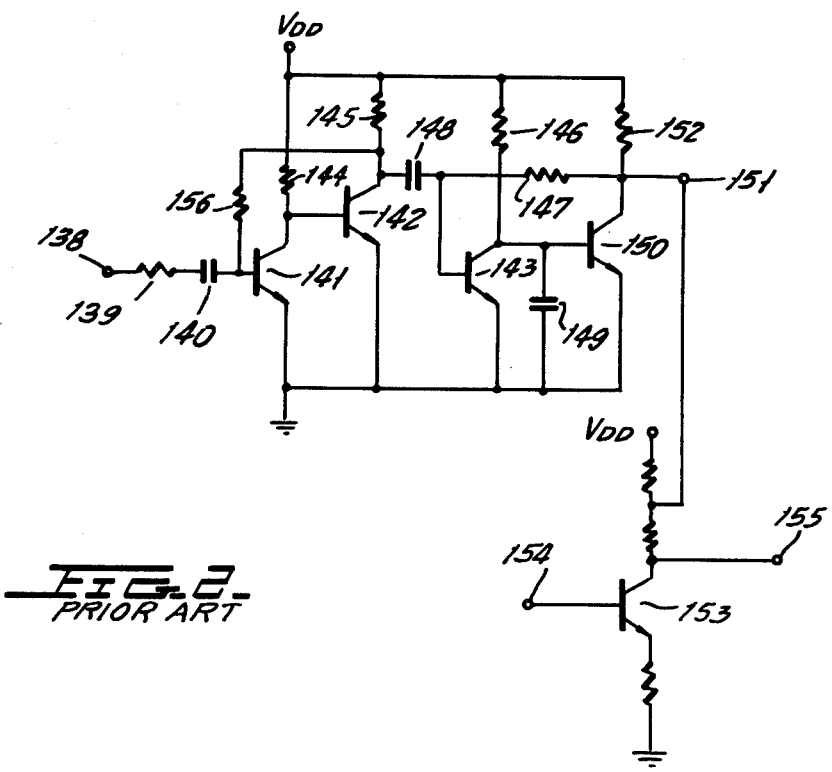
FIG. 2 is a schematic diagram of a squelch control circuit included in the receiver shown in FIG. 1.

The squelch control circuit 11 is shown in detail in FIG. 2. The demodulated output of the frequency discriminator 8 (FIG. 1) is fed via a terminal 138 to a resistor 139 and a capacitor 140, which are adapted to extract (pass) only the noise component outside the audio frequency band. The noise component is supplied to a transistor 141. Transistors 142 and 143, resistors 144, 147 and 156 and a capacitor 148 combine to form circuit for amplifying the extracted noise component. A capacitor 149 picks up a d.c. component out of the noise component to turn on and off a transistor 150 which has a load resistor 152, thereby switching the voltage appearing at a terminal 151. A transistor 153 which forms part of the audio frequency amplifier in the audio frequency circuit 9 (FIG. 1), includes a terminal 154 for receiving the demodulated output of the frequency discriminator 8 and an output terminal 155. When the voltage at the terminal 151 is switched, the transistor 153 is turned on or off to render the audio frequency circuit 9 conductive or non-conductive. The other squelch control circuit 11' is constructed in the same way as the squelch control circuit 11 described above.

In this manner, the prior art receiver with a switch capacitor filter requires a clock generator for exclusive use and squelch control circuits also for exclusive use. This type of receiver, as previously discussed, cannot avoid intricacy of construction as well as poor reliability of operation.

DESCRIPTION OF THE PREFERRED EMBODIMENT

Figure 3:
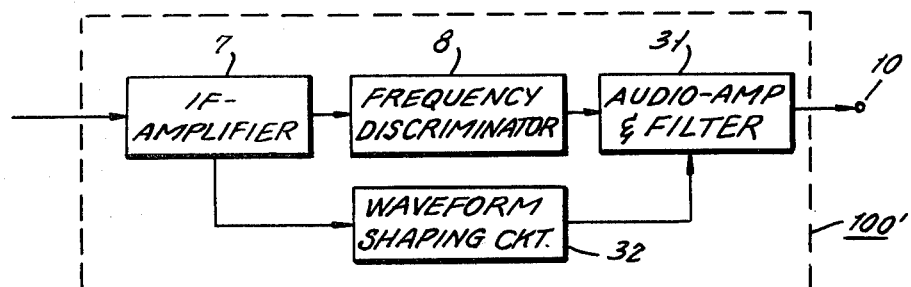
FIG. 3 is a block diagram showing an embodiment of the present invention.

Referring to FIG. 3, a block 100' corresponds to the block 100 which is included in the receiver shown in FIG. 1. In FIG. 3, the same reference numerals as those of FIG. 1 designate the same structural elements. The second frequency mixer 5 (FIG. 1) supplies an intermediate frequency (IF) amplifier 7 with an intermediate frequency (IF) signal. The output of the IF amplifier 7 is applied to a frequency discriminator 8 for phase- or frequency-demodulation. The resulting audio frequency signal is selected and amplified by an audio frequency amplifier 31, which includes a switched capacitor filter therein. This switched capacitor filter is switched by a pulse signal which is provided from a waveform shaping circuit 32 to the amplifier 31.

As will be described in detail, the waveform shape circuit 32 picks up the IF signal at a point lying between suitable stages of the IF amplifier 7 and shapes its waveform to provide a pulse signal for clocking the switch capacitor filter. It is a primary requisite that the signal input to the waveform shaping circuit 32 has a waveform which has not been amplitude-limited by the amplifier 7 (in contrast the output of amplifier 7 to the frequency discriminator 8 is amplitude-limited). Consequently, when the IF signal coupled to the IF amplifier 7 has an amplitude smaller than a threshold level, the waveform shaping circuit 32 is deactivated to stop the delivery of the clocking pulse signal therefrom. With this construction, the circuit 32 delivers a pulse signal for switching the switched capacitor filter as long as its input is above the threshold level; the delivery of the clocking pulse signal will be stopped in response to an input below the threshold level thereby deactivating the switched capacitor filter. Upon deactivation, the switched capacitor filter intercepts the output of the audio frequency amplifier 31 so that no output appears at the output terminal 10. Stated another way, the circuit 32 and the audio frequency amplifier 31 cooperate with the switched capacitor filter to serve the squelching function.

Figure 4A:
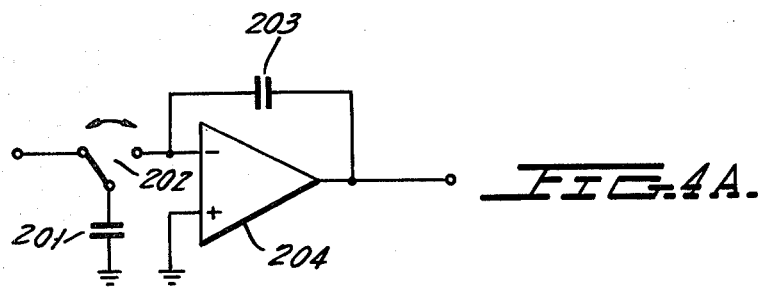
FIGS. 4A–4C are diagrams respectively showing the principle of operation, a practical example and an equivalent circuit each of a switched capacitor filter included in an audio frequency amplifier shown in FIG. 3.
Figure 4B:
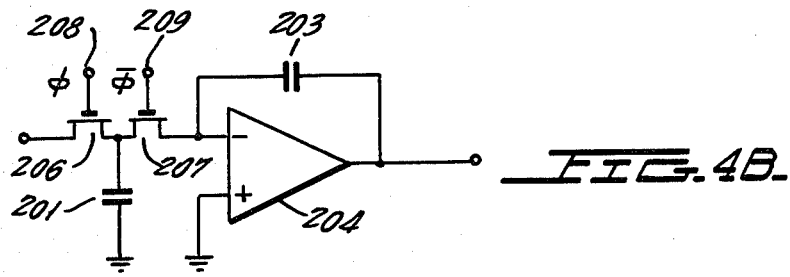
Figure 4C:
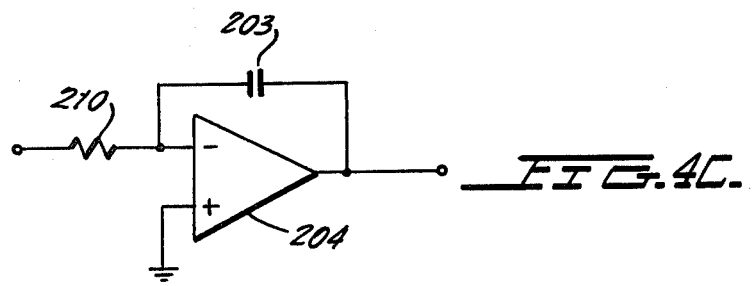

Referring to FIG. 4A, the switched capacitor filter (which forms part of audio amplifier and filter 31) has a capacitor 201 which is repeatedly charged and discharged by a switch 202 and, when averaged with respect to time, functions as a resistor 210 as shown in FIG. 4C. The resistor 210 coacts with a capacitor 203 and an operational amplifier 204 to form a low-pass filter for passing the audio frequency therethrough.

As shown in FIG. 4B, the switch 202 illustrated in FIG. 4A is actually made up of first and second MOS FETs 206 and 207. Gates 208 and 209 of the MOS FETs are respectively supplied with clock pulses $\phi$ and $\bar{\phi}$ which are inverse to each other. These clock pulses together define a control signal which determines the effective resistance of the capacitor 201. Coupled to these gates 208 and 209 are the output pulses of the waveform shaping circuit 32 (which pulses define the clock pulses $\phi$ and $\bar{\phi}$, respectively). During the intervals when no clock pulses are applied to the gates 208 and 209, the MOS FETs 206 and 207 constantly remain nonconductive maintaining the switched capacitor filter deactivated. This if the "OFF" condition of the audio frequency amplifier 31 in the course of the squelching function previously described.

The resistance R of the equivalent resistor 210 shown in FIG. 4C may be expressed as:

$$R = (1/f_c C)$$

where C is the capacitor of the capacitor 201 and $f_c$ is the frequency of the clock pulses. The clock frequency $f_c$ usually ranges from 10 to 20 times (or more) the pass band. The clocking pulse applied by the waveform shaping circuit 32 (FIG. 3), which is the shaped version of the IF signal, has a frequency of 455 KHz or 10.7 MHz which is usable for clocking the switched capacitor filter. The IF signal of 455 KHz is optimum as a clock for the switched capacitor filter, while the 10.7 MHz signal is somewhat questionable bearing in mind the presently available response of MOS FETs. Still, the 10.7 MHz signal will be potentially hopeful if it is divided into the approximate range of $\frac{1}{4}-1/64$. The conversion of the capacity of a switched capacitor into a resistance with respect to a frequency is readily achievable based on the equation shown above, thus accommodating a change in frequency with ease.

Figure 5:
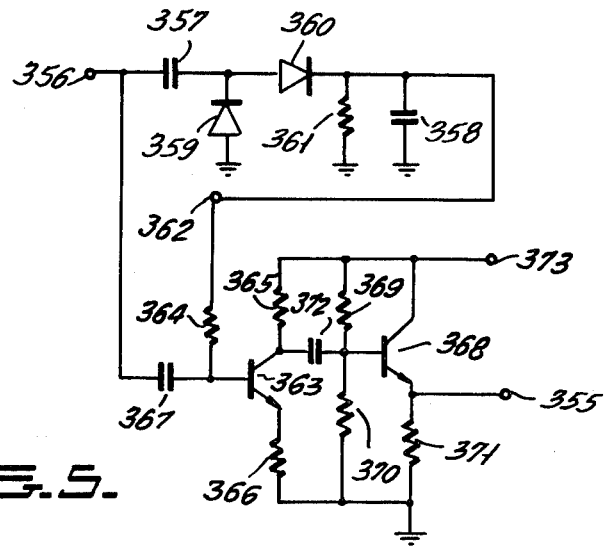
FIG. 5 is a schematic diagram of a practical example of a waveform shape circuit shown in FIG. 3.

Referring to FIG. 5, the function of the waveform shape circuit is, as already mentioned, to generate a clock signal having a certain level and a 50 percent duty cycle, as soon as the input electric field level increases beyond a predetermined value. In FIG. 5 the reference numeral 356 designates an IF signal input terminal which is connected to an output between suitable stages of the IF amplifier 7 (FIG. 3). The IF signal is rectified by capacitors 357 and 358, diodes 359 and 360 and a resistor 361 to have a d.c. level. As the input electric field level increases beyond a predetermined value a driver voltage high enough to turn on a transistor 363 appears at a terminal 362 so that the IF signal from the terminal 356 is amplified to a predetermined level by an amplifier which is made up of a transistor 363, resistors 364–366 and a capacitor 367. The amplified IF signal is delivered as clock pulses to an output terminal 355 via a buffer amplifier which comprises a transistor 368, resistors 369–371 and a capacitor 372. The reference numeral 373 designates a power source terminal.

Figure 6:
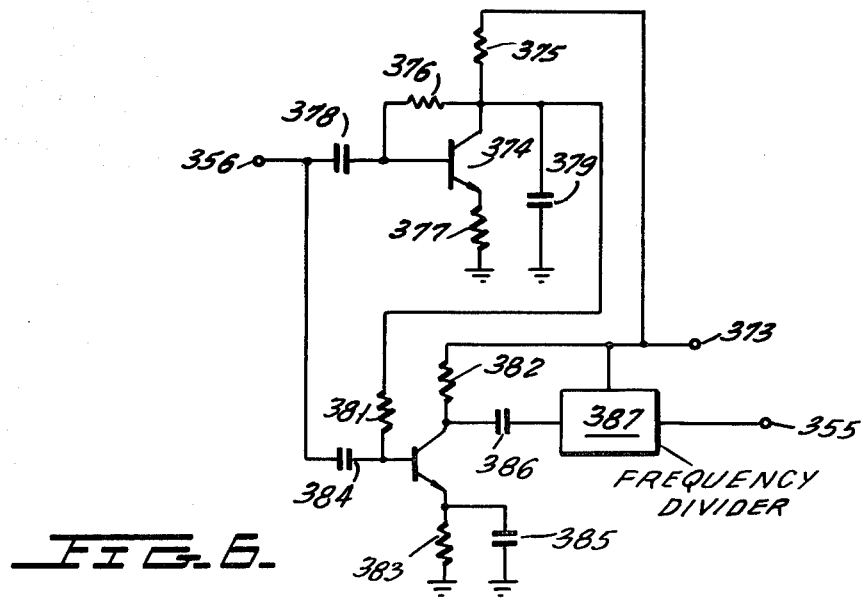
FIG. 6 is a schematic diagram of another example of the waveform shape circuit shown in FIG. 3.

Referring to FIG. 6, another possible form of the waveform shaping circuit shown in FIG. 3 is illustrated. The IF signal coming in through the terminal 356 is rectified by a rectifier circuit made up of a transistor 374, resistors 375-377 and capacitors 378 and 379, to provide a bias voltage to a transistor 380. When the IF signal is beyond a predetermined level, the transistor 380 is supplied with a bias voltage which turns it on. Then, an IF amplifier formed by the transistor 380, resistors 381-382 and capacitors 384-386 is activated to amplify the IF signal to a level which the signal requires as a clock. The output of the IF amplifier is suitably divided by a frequency divider 387 which comprises a flip-flop or the like while being thereby provided with a duty cycle of 50 percent. The output of the frequency divider 387 is delivered to the terminal 355.

In summary, it will be seen that the present invention provides a receiver in which a waveform shaping circuit functions both as a clock generator necessary for a switched capacitor filter and a circuit necessary for a squelch control. The number of structural elements of the waveform shaping circuit shown in FIGS. 5 or 6 is substantially equal to that of the squelch control circuit shown in FIG. 2 and, therefore, the receiver of the present invention achieves a simpler clock generator for a switched capacitor filter than in the prior art receiver.

What is claimed is:

1. A receiver comprising:
   a first amplifier means for receiving and amplifying an angle modulated signal;
   a demodulator means connected to a first output of said first amplifier means for demodulating the amplified angle-modulated signal;
   a switched capacitor filter means including a switched capacitor for selecting an audio frequency signal out of the output of said demodulator means and amplifying said audio frequency signal, said switched capacitor filter means having a pass band which is dependent on the frequency of a control signal for switching said switched capacitor; and
   a waveform shaping means for shaping the waveform of a second output of said first amplifier means when the waveform level of the second output of said first amplifier means is above a predetermined level, said waveform shaping means supplying the shaped waveform output thereof to said switched capacitor filter means as said control signal.

2. A receiver as claimed in claim 1, in which said waveform shaping means comprises:
   a driver means for rectifying and converting the second output of said first amplifier means into a d.c. signal; and
   a waveform shaping and amplifying means coupled to said driver means for shaping the waveform of the second output of said first amplifier means to provide an output which is the output of said waveform shaping means, said waveform shaping and amplifying means generating said output only when said d.c. signal is above said predetermined level.

3. A receiver as claimed in claim 2, in which said waveform shaping and amplifying means includes a frequency divider.

4. A receiver as claimed in claim 1, further comprising a second amplifier means for receiving and amplifying an incoming angle modulated carrier wave; and a frequency mixer means for converting the frequency of an output of said second amplifier into said angle-modulated signal.

5. A receiver circuit, comprising:
   an amplifier for amplifying a received angle modulated signal, said amplifier having a first output which is amplitude-limited and a second output which is not amplitude-limited;
   a demodulator connected to said first output for demodulating said amplified signal;
   a switched capacitor filter circuit connected to an output of said demodulator for amplifying and band passing said demodulated signal, said switched capacitor filter circuit including a capacitor and a switching circuit for charging and discharging said capacitor at a frequency determined by the frequency of clock signals applied thereto whereby said capacitor functions as a resistor; and
   a wave shaping circuit connected to said second output of said amplifier, said wave shaping circuit converting said non-amplitude-limited amplified signal generated by said amplifier into said clock signals only when the magnitude of said received angle modulated signal is greater than a predetermined value whereby said wave shaping circuit operates as both a clock signal generator and a squelching circuit.

6. A receiver circuit as claimed in claim 5, wherein said wave shaping circuit comprises:
   a driver circuit for rectifying and converting the non-amplitude-limited output of said amplifier into a d.c. signal; and
   a waveform shaping and amplifying circuit coupled to said driver circuit for shaping the waveform of said second output of said amplifier so as to generate said clock signals, said waveform shaping and amplifying means generating said clock signals only when said d.c. signal is above a predetermined level corresponding to said predetermined value.

7. A receiver circuit as claimed in claim 6, wherein said waveform shaping and amplifying circuit includes a frequency divider.

* * * * *